United States Patent
Bessems et al.

(10) Patent No.: US 9,625,829 B2
(45) Date of Patent: Apr. 18, 2017

(54) FLUID HANDLING STRUCTURE, A LITHOGRAPHIC APPARATUS AND A DEVICE MANUFACTURING METHOD

(75) Inventors: David Bessems, Eindhoven (NL); Cornelius Maria Rops, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 765 days.

(21) Appl. No.: 13/610,626

(22) Filed: Sep. 11, 2012

(65) Prior Publication Data

US 2013/0070220 A1 Mar. 21, 2013

Related U.S. Application Data

(60) Provisional application No. 61/535,066, filed on Sep. 15, 2011.

(51) Int. Cl.
*G03B 27/52* (2006.01)
*G03F 7/20* (2006.01)

(52) U.S. Cl.
CPC ..... *G03F 7/70341* (2013.01); *Y10T 137/8593* (2015.04)

(58) Field of Classification Search
CPC ....... G03F 7/70341; G03F 7/2041; G03F 7/70
See application file for complete search history.

(56) References Cited

U.S. PATENT DOCUMENTS

| 4,509,852 | A | 4/1985 | Tabarelli et al. | |
|---|---|---|---|---|
| 7,394,522 | B2 | 7/2008 | Hasegawa et al. | |
| 7,924,402 | B2 | 4/2011 | Nagasaka et al. | |
| 2004/0207824 | A1 | 10/2004 | Lof et al. | |
| 2006/0038968 | A1 | 2/2006 | Kemper et al. | |
| 2006/0103818 | A1* | 5/2006 | Holmes et al. | 355/53 |
| 2006/0232756 | A1* | 10/2006 | Lof et al. | 355/53 |
| 2007/0296939 | A1 | 12/2007 | Nishii | |
| 2008/0212046 | A1* | 9/2008 | Riepen et al. | 355/30 |
| 2009/0168032 | A1* | 7/2009 | Kate et al. | 355/30 |
| 2009/0279058 | A1 | 11/2009 | Hasegawa | |
| 2010/0304310 | A1 | 12/2010 | Sato | |
| 2010/0313974 | A1 | 12/2010 | Riepen et al. | |
| 2011/0090472 | A1 | 4/2011 | Riepen et al. | |
| 2011/0134401 | A1 | 6/2011 | Rops et al. | |
| 2011/0194084 | A1 | 8/2011 | Riepen et al. | |

FOREIGN PATENT DOCUMENTS

| EP | 1 420 298 | 5/2004 |
|---|---|---|
| WO | 99/49504 | 9/1999 |

\* cited by examiner

*Primary Examiner* — Mesfin Asfaw
(74) *Attorney, Agent, or Firm* — Pillsbury Winthrop Shaw Pittman LLP

(57) ABSTRACT

A fluid handling structure for a lithographic apparatus has, at a boundary of a space configured to contain immersion fluid to a region external to the fluid handling structure, a gas supply opening radially outward of the space, a fluid recovery opening radially outward of the gas supply opening, and a damper surface extending at least 0.5 mm radially outwards from the fluid recovery opening along the undersurface of the fluid handling structure.

19 Claims, 5 Drawing Sheets

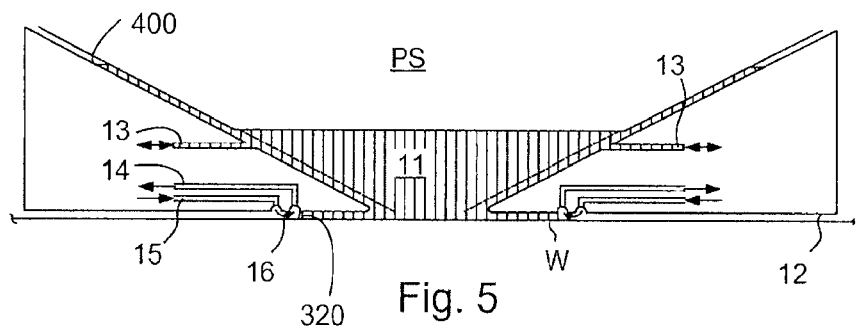
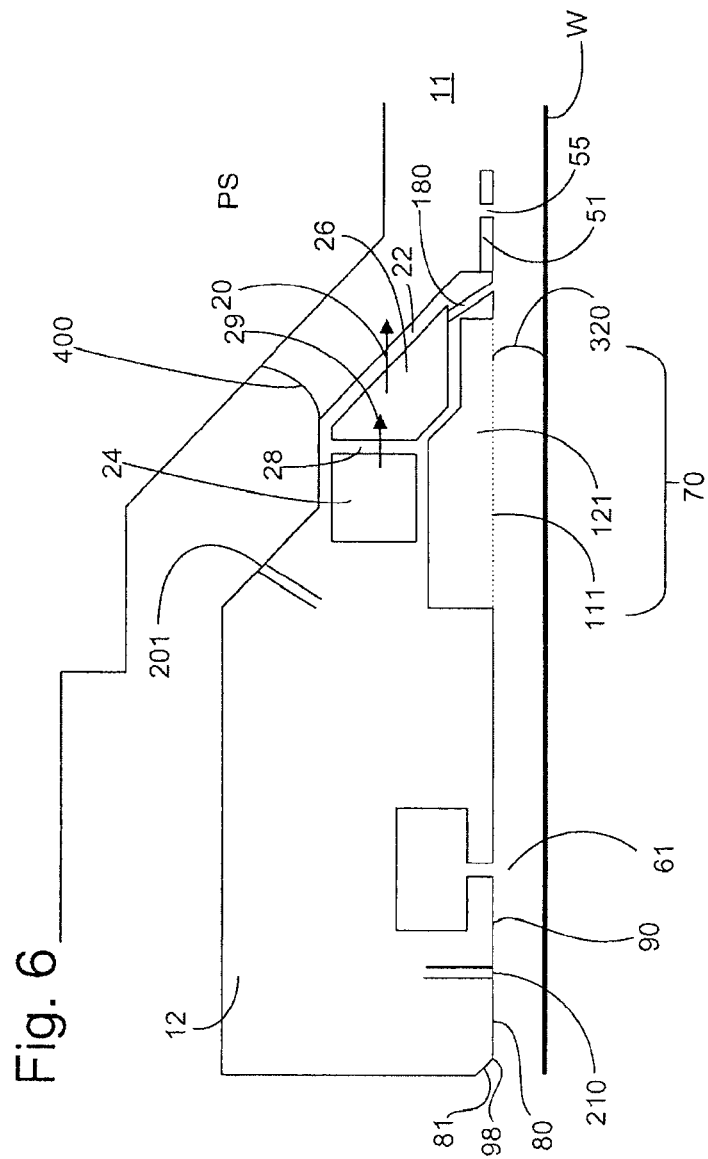

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application No. 61/535,066, filed on Sep. 15, 2011. The content of that application is incorporated herein in its entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

A fluid handling structure may comprise a gas supply opening that supplies gas. The gas may have a special physical property, for example it may provide an atmosphere around a liquid meniscus which may enable gas bubbles formed in the immersion liquid, such as water, to dissolve more readily than atmospheric gas (e.g., air). Image defectivity caused by gas bubbles in the immersion space may be reduced. The atmosphere around the meniscus may suppress evaporation of liquid from the meniscus by having a high level of humidity. The gas external to the fluid handling structure may have a special physical property. The external gas, such as air, may form an atmosphere with a substantially constant refractive index, which facilitates accurate positioning and measurement. If the two gases mix by a small quantity escaping to the other, the desired performance of the respective atmosphere is reduced. The respective atmosphere is contaminated. For example, gas bubbles may less readily dissolve in the immersion space, increasing defectivity and decreasing yield. If the external atmosphere has a non-uniform refractive index, this may interfere undesirably with performance of an interferometer, or other optical component, outside the fluid handling structure.

It is desirable, for example, to provide a lithographic apparatus in which mixing of gas from and external to the fluid handling structure is at least partly reduced or prevented.

According to an aspect, there is provided a fluid handling structure for a lithographic apparatus, the fluid handling structure having, at a boundary of a space configured to contain immersion fluid to a region external to the fluid handling structure: at least one gas supply opening radially outward of the space; at least one fluid recovery opening radially outward of the at least one gas supply opening; and a damper surface extending at least 0.5 mm radially outwards from the at least one fluid recovery opening along the undersurface of the fluid handling structure.

According to an aspect, there is provided a device manufacturing method, comprising: projecting a patterned beam of radiation through an immersion liquid confined to a space between a projection system and a substrate by a fluid handling structure; providing gas through at least one gas supply opening to a position adjacent a meniscus of the immersion liquid; recovering gas through at least one fluid recovery opening radially outward of the at least one gas supply opening; and damping the movement of gas from the at least one fluid recovery opening to radially outward of the fluid handling structure by a damper surface extending at least 0.5 mm radially outwards from the at least one fluid recovery opening along the undersurface of the fluid handling structure.

According to an aspect, there is provided a fluid handling structure that has, at a boundary of a space configured to contain immersion fluid to a region external to the fluid handling structure: at least one gas supply opening radially outward of the space; at least one fluid recovery opening radially outward of the at least one gas supply opening; and a damper surface extending radially outwards from the at least one fluid recovery opening along the undersurface of the fluid handling structure, wherein the separation between the at least one fluid recovery opening and an outer radial edge of the undersurface is at least five times the distance between the fluid handling structure and a facing surface facing a projection system of an immersion lithographic apparatus.

According to an aspect, there is provided a device manufacturing method, comprising: projecting a patterned beam of radiation through an immersion liquid confined to a space between a projection system and a substrate by a fluid handling structure; providing gas through at least one gas supply opening to a position adjacent a meniscus of the immersion liquid; recovering gas through at least one fluid recovery opening radially outward of the at least one gas supply opening; and damping the movement of gas from the at least one fluid recovery opening to radially outward of the fluid handling structure by a damper surface extending radially outwards from the at least one fluid recovery opening along the undersurface of the fluid handling structure, wherein the separation between the at least one fluid recovery opening and an outer radial edge of the undersurface is at least five times the distance between the fluid handling structure and a facing surface facing the projection system.

According to an aspect, there is provided a fluid handling structure for a lithographic apparatus, the fluid handling structure having, at a boundary of a space configured to contain immersion fluid to a region external to the fluid handling structure: at least one gas supply opening radially outward of the space; and at least one fluid recovery opening radially outward of the at least one gas supply opening, wherein the separation between the at least one fluid recovery opening and an outer radial edge of the undersurface of the fluid handling structure is less than or equal to the separation between the at least one gas supply opening and the at least one fluid recovery opening.

According to an aspect, there is provided a fluid handling structure for a lithographic apparatus comprising a projection system and a substrate table configured to support a substrate, the fluid handling structure configured to confine immersion liquid to a space between the projection system and a facing surface, the fluid handling structure having an undersurface region external and surrounding the space. The fluid handling structure has: at least one gas supply opening outward of the space, the gas supply opening configured to supply a gas flow between the undersurface and facing surface; and a blocking damper between the gas supply opening and an outer edge of the undersurface of the fluid handling structure, the blocking damper configured to substantially block a radial gas flow from the gas supply opening to an atmosphere external the fluid handling structure, or to substantially block a radial gas flow from the external atmosphere to the gas supply opening, or both, so as to substantially prevent mixing between the gas from the gas supply opening and the external atmosphere.

According to an aspect, there is provided a fluid handling structure that has, at a boundary of a space configured to contain immersion fluid to a region external to the fluid handling structure: at least one gas supply opening radially outward of the space; at least one fluid recovery opening radially outward of the at least one gas supply opening; an outer damper surface extending radially outwards from the at least one fluid recovery opening along an undersurface of the fluid handling structure so as to restrict gas flow from the at least one gas recovery opening to an outer radial edge of the undersurface of the fluid handling structure; and an inner damper surface extending radially between the at least one gas supply opening and the at least one fluid recovery opening along the undersurface of the fluid handling structure so as to restrict gas flow from the at least one fluid recovery opening to the at least one gas supply opening, wherein the inner damper surface and the outer damper surface restrict the gas flows approximately equally.

According to an aspect, there is provided an immersion lithographic apparatus, comprising: a projection system; a substrate table configured to support a substrate; and any fluid handling structure described herein, wherein the fluid handling structure is configured to confine immersion liquid to a space between the projection system and a facing surface facing the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further fluid handling system for use in a lithographic projection apparatus;

FIG. 6 depicts, in cross-section, a further fluid handling system for use in a lithographic projection apparatus;

DETAILED DESCRIPTION

Figure 1:
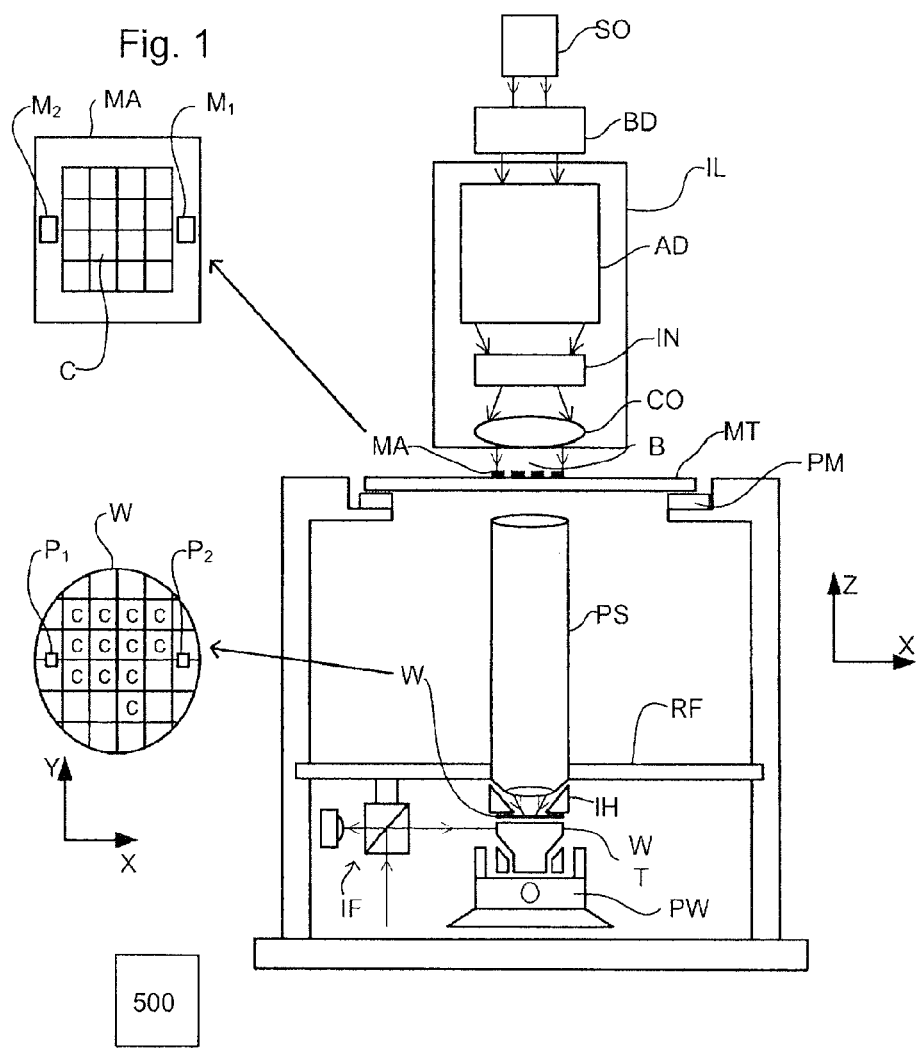
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
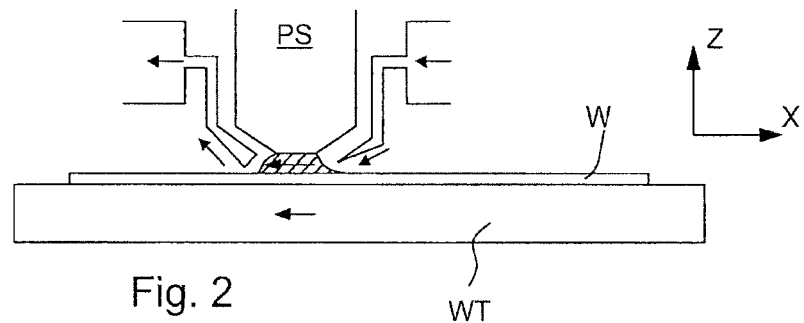
FIGS. 2 and 3 depict a fluid handling system for use in a lithographic projection apparatus.
Figure 3:
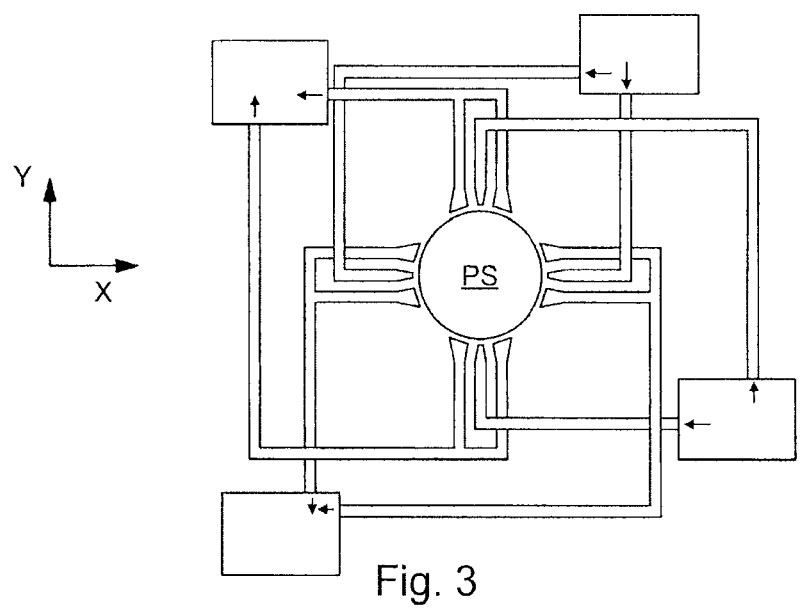

As illustrated in FIGS. 2 and 3, liquid is supplied by at least one inlet onto the substrate, desirably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
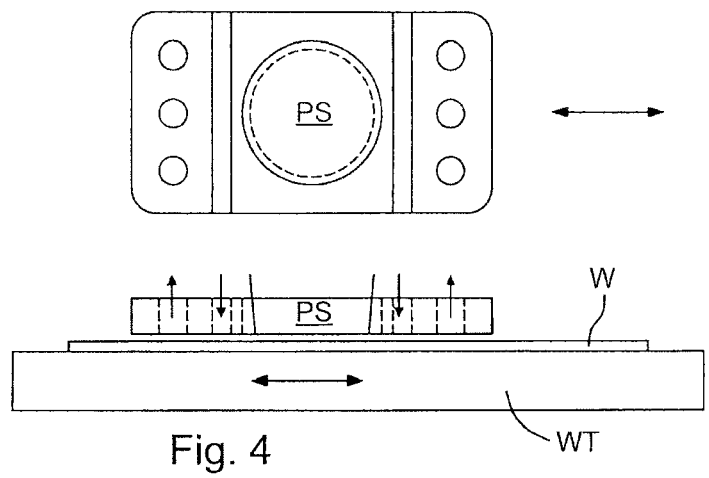
FIG. 4 depicts a further fluid handling system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

FIG. 6 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An under pressure in chamber 121 is chosen is such that the meniscuses formed in the holes of the porous material 111 substantially prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than or equal to 90°, desirably less than or equal to 85° or desirably less than or equal to 80°, to the immersion liquid, e.g. water.

In an embodiment, the liquid supply system has an arrangement to deal with variations in the level of the liquid. This is so that liquid which builds up between the projection system PS and the liquid confinement structure 12 (forming, e.g., a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain height relative to the structure 12.

Figure 7:
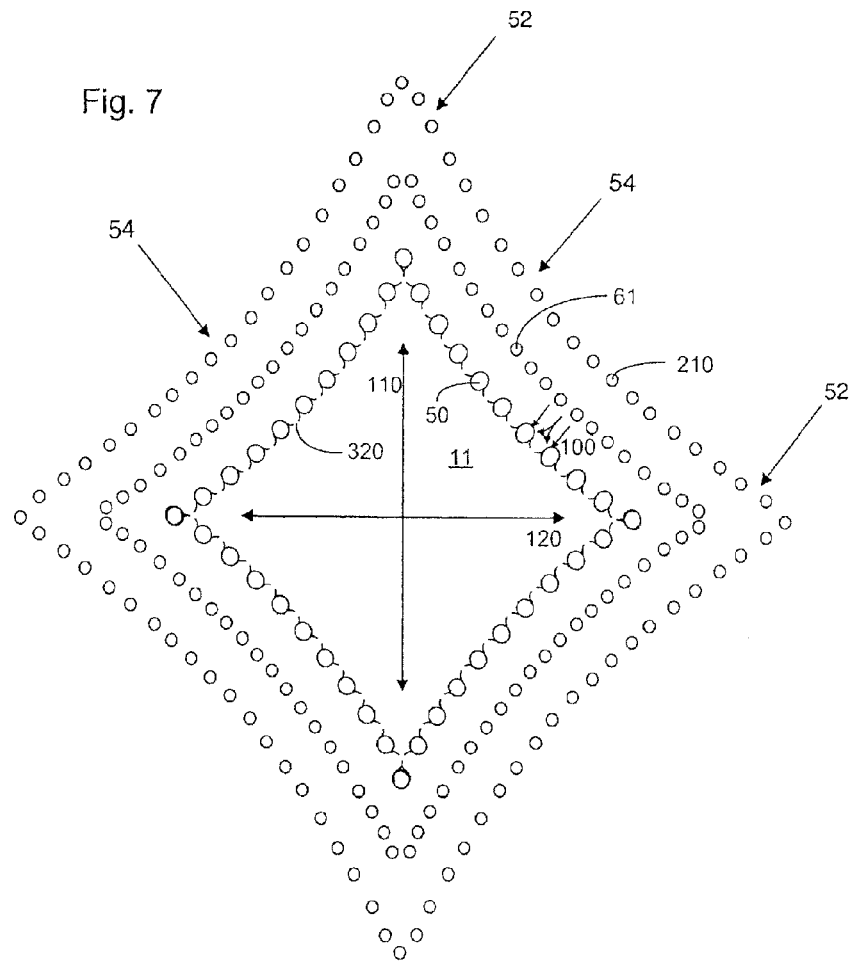
FIG. 7 depicts, in plan, a fluid handling system for use in a lithographic projection apparatus.

FIG. 7 illustrates schematically and in plan meniscus pinning features of a fluid handling system or of a fluid handling structure 12 having an extractor embodying the gas drag principle and to which an embodiment of the present invention may relate. The features of a meniscus pinning device are illustrated which may, for example, replace the meniscus pinning arrangement 14, 15, 16 of FIG. 5 or at least the extractor assembly 70 shown in FIG. 6. The meniscus pinning device of FIG. 7 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, greater than or equal to 0.5 mm, or greater than or equal to 1 mm. In an embodiment, the length dimension is selected from the range of 0.1 mm to 10 mm or selected from the range of 0.25 mm to 2 mm. In an embodiment, the width of each opening is selected from the range of 0.1 mm to 2 mm. In an embodiment the width of each opening is selected from the range of 0.2 mm to 1 mm. In an embodiment the length dimension is selected from the range of 0.2 mm to 0.5 mm or selected from the range of 0.2 mm to 0.3 mm. Inlet openings like those of FIG. 6 (labeled 180) may be provided radially inwardly of the openings 50.

Each of the openings 50 of the meniscus pinning device of FIG. 7 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 7 the openings are fluid extraction openings. Each opening is an inlet for the passage of gas, liquid or a two phase fluid of gas and liquid, into the fluid handling system. Each inlet may be considered to be an outlet from the space 11.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 320 between the openings 50 substantially in place as illustrated in FIG. 7. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment, liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 7, the openings 50 are positioned so as to form, in plan, a cornered shape (i.e. a shape with corners 52). In the case of FIG. 7 this is in the shape of a rhombus, desirably a square, with curved edges or sides 54. The edges 54, if curved, have a negative radius. The edges 54 may curve towards the center of the cornered shape in areas away from the corners 52. An embodiment of the invention may be applied to any shape, in plan, including, but not limited to the shape illustrated, for example, a rectilinear shape, e.g. a rhombus, a square or rectangle, or a circular shape, a triangular shape, a star shape, an elliptical shape, etc.

The cornered shape has principal axes 110, 120 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of about 90° to 105°, in an embodiment selected from the range of about 85° to 105°.

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning feature radially inwardly of the openings 50. The meniscus is pinned between the openings 50 with drag forces induced by gas flow into the openings 50. A gas drag velocity of greater than or equal to about 15 m/s, desirably about 20 m/s should be sufficient. The amount of evaporation of liquid from the substrate may be reduced thereby reducing both splashing of liquid as well as thermal expansion/contraction effects.

Other geometries of the bottom of the fluid handling structure 12 are possible. For example, any of the structures disclosed in U.S. patent application publication no. US 2004-0207824 or U.S. patent application publication no. US 2010-0313974 could be used in an embodiment of the present invention. The openings may be in a two dimensional array. The openings may have the appearance of a microsieve.

In an embodiment the at least one gas supply opening comprises a gas knife, such as that described in US 2010/0313974, in the form of a slit opening (e.g. a continuous linear opening) around the openings 50. A gas knife in the form of a slit opening may also be provided around the extractor 70 of the FIG. 6 embodiment. A gas knife in the form of a slit opening might typically have a width of 50 μm.

In an embodiment shown in FIGS. 6 and 7, the at least one gas supply opening 61 comprises a plurality of gas supply openings 61 (i.e. discrete apertures) in a linear array. (In another embodiment, the gas supply opening is a linear opening, i.e. a slit.) Relative to the space, the gas supply openings 61 are provided radially outward of the meniscus pinning feature (the extractor 70 and openings 50, respectively). The linear array made by the gas supply openings 61 may be substantially parallel to the lines joining the openings 50. In use, the gas supply openings 61 are connected to an over pressure and form a gas knife (supplying a gas, e.g. air) surrounding the meniscus pinning device. The plurality of gas supply openings 61 in a linear array (e.g. a one or two dimensional linear array) at least partly surround the meniscus pinning feature.

A plurality of gas supply openings 61 is easier to manufacture than a gas knife in the form of a slit and can reduce variations in the pressure particularly radially inwardly of the at least one gas supply opening 61, around the periphery (e.g., circumference) of the meniscus pinning feature. Additionally, a plurality of gas supply openings 61 may be less sensitive to the presence of contamination than a gas knife in the form of a slit. This again improves the stability in underpressure around the periphery of the meniscus pinning feature. Further, the operating underpressure may be smaller than for an equivalent slit shaped gas knife, for example, in a recirculation zone (which features is described herein). A plurality of gas supply openings may beneficially disturb (e.g. splash) less immersion liquid from the gap between the edge of a substrate and a surrounding surface, for example when the edge of a substrate passes under the immersion space, reducing the distribution of escaped liquid from the space and the associated thermal load and/or contamination.

One example of a linear array is a line. One example of a linear array comprises two or more rows of openings. The openings may be periodically arranged along the linear array. For example the openings along the rows may be staggered. In one or more of the rows of openings, each of the openings may be aligned in a line. The openings in two of the rows may be staggered with respect to each other (i.e. two lines of holes).

In an embodiment the linear array in which the gas supply openings 61 are arranged is substantially parallel to the line of the meniscus pinning feature (e.g. openings 50). In an embodiment a substantially constant separation between adjacent ones of the meniscus pinning feature (e.g. openings 50) and the gas supply openings 61 is maintained.

In an embodiment the plurality of gas supply openings 61 in a linear array acts as a gas knife. In order for the discrete gas supply openings 61 to exhibit gas knife like functionality, an open area of, for example, less than or equal to $6.0 \times 10^{-5}$ m$^2$ per meter length is desirable. The gas supply openings 61 in the linear array of openings may be in the range of 30 to 100 micrometers.

As illustrated in cross section in FIG. 6 and in plan in FIG. 7, in an embodiment at least one fluid recovery opening 210 is provided radially outwardly of the plurality of discrete gas supply openings 61 in a linear array.

In an embodiment the at least one fluid recovery opening 210 may be a plurality of fluid recovery openings 210. In an embodiment at least one fluid recovery opening 210 is a slit opening (i.e. continuous). In an embodiment each space between adjacent gas supply openings 61 has a corresponding fluid recovery opening 210.

In an embodiment where the at least one fluid recovery opening 210 is a plurality of fluid recovery openings 210, the gas knife may be in the form of a slit or continuous opening. That is, the at least one gas supply opening 61 actually comprises a slit (i.e. continuous) opening.

The fluid recovery openings 210 may have the same characteristics and/or dimensions as the gas supply openings 61 described above. The at least one fluid recovery opening 210 may be discontinuous, continuous, a two dimensional linear array (e.g. two substantially parallel lines of openings), etc. The fluid recovery openings 210 may recover gas from the space between the fluid handling structure and the facing surface. The fluid recovery openings 210 may recover liquid which has escaped from the space 11.

In an embodiment, the distance (e.g. the radial distance) between the at least one fluid recovery opening 210 and the plurality of gas supply openings 61 is at least 0.2 mm and at most 2.5 mm, for example in the range of 0.2 mm and 1 mm. This is a relatively short distance. Such a short distance is advantageous because a droplet (escaped from the immersion space 11) is more likely to be captured by recovery through the fluid recovery opening 210. If the distance is too short, this can lead to interference to the gas flow which flows out of the gas supply openings 61 and into the fluid recovery opening 210 which is undesirable.

A controller 500 is provided to control the flow rates. The flow rates, the dimensions of the features of the under surface of the fluid handling structure 12 or both can be adjusted to achieve the desired pressure profiles.

Liquid may escape from the space 11 and form a droplet. The droplet is generally static relative to the surface on which it is located. This surface moves relative to the immersion space 11. Thus a droplet may collide with a meniscus 320 of the immersion space 11, located between the undersurface of the fluid handling structure 12 and the facing surface. Such a collision may form a bubble (which may be very small) which enters into the immersion space 11. If such a bubble reaches the path of projection beam it may interfere with the beam causing a defect in the exposed image, increasing defectivity.

Gas from the bubble may dissolve in the immersion liquid before the bubble reaches the exposure area of the space 11, reducing or extinguishing the bubble size. Dissolution speed is dependent upon the type of the trapped gas and the properties of the immersion liquid used. In an embodiment, which can be combined with any other embodiment, dissolution speed of the bubble may be enhanced by changing the gas content of the gas in the bubble so that the defectivity risk may be reduced.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve. Air, by volume, is about 80% nitrogen. In an embodiment, the gas atmosphere around the meniscus 320 may be carbon dioxide.

U.S. patent application publication no. US 2011-0134401, hereby incorporated in its entirety by reference, describes supplying a gas with a solubility in the immersion liquid greater than or equal to $5\times10^{-3}$ mol/kg at 20° C. and 1 atm total pressure to a region adjacent the space 11. It also describes supplying a gas with a diffusivity in the immersion liquid greater than or equal to $3\times10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11. Carbon dioxide is such a gas.

If the bubble of gas is of a gas which has a high diffusivity, solubility or product of diffusivity and solubility in the immersion liquid, it will dissolve into the immersion liquid much faster. Therefore, using an embodiment of the invention should reduce the number of imaging defects thereby allowing higher throughput (e.g., higher speed of the substrate W relative to the liquid handling structure 12) and lower defectivity.

Therefore, in an embodiment of the present invention the at least one gas supply opening 61 is configured to supply gas to a region (e.g. to a volume, or towards an area) adjacent the space 11. For example, gas is provided such that it is present in the region adjacent to the meniscus 320 extending between the facing surface and the liquid handling structure 12.

An example gas is carbon dioxide which may be desirable because it is readily available and may be used in immersion systems for other purposes. Carbon dioxide has solubility in water at 20° C. and 1 atm total pressure of $1.69\times10^{-3}$ kg/kg or $37\times10^{-3}$ mol/kg. Any non-reactive gas which readily dissolves in immersion liquid is suitable.

An embodiment of the present invention herein described may form a $CO_2$ atmosphere around the meniscus 320 of immersion liquid so that any inclusion of gas into the immersion liquid creates a gas inclusion which dissolves in the immersion liquid.

By using gaseous $CO_2$ the problem associated with the meniscus colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet could be less significant. The immersion system could be more tolerant of interacting with immersion liquid which had escaped from the space.

Carbon dioxide can be provided through gas supply openings 61. In an embodiment, the gas is supplied through a second array of gas supply openings or through both the gas supply openings and the second array of gas openings.

In an embodiment the flow rate of carbon dioxide out of openings 50 summed with the flow rate of gas out of fluid recovery openings 210 is greater than or equal to the flow rate of gas out of gas supply openings 61. In an embodiment, the summed gas extraction rate is more than or equal to 1.2 or desirably more than or equal to 1.4 times the gas supply rate. For example, the gas flow rate into the openings 50 may be 60 liters per minute, the gas flow rate into fluid recovery openings 210 may be 60 liters per minute and the gas flow rate out of gas supply openings 61 may be 90 liters per minute. In an embodiment, flow regime through the openings 50, the fluid recovery opening 210 and the gas supply openings 61 may be characterized by a net flow rate from the external atmosphere surrounding the fluid handling structure 12. The net flow rate from the external atmosphere may be in the range of 0 to 45 liters per minute. This arrangement is advantageous if the gas supplied out of the gas supply openings 61 is carbon dioxide (described below). This is because carbon dioxide may interfere with an interferometer outside the fluid handling structure 12. By arranging the flow rates as described, loss of carbon dioxide out of the fluid handling structure 12 can be reduced or prevented.

In the case of using $CO_2$ in the gas knife, flow variations resulting from an inhomogeneity in the gas flow (such as that which appears when using a slit gas knife) can result in gas which is not $CO_2$ (e.g. air) from the external atmosphere outside of the fluid handling structure 12 being mixed into the flow which can then reach the openings 50. This can be undesirable because the external atmosphere gas (e.g., air) may contaminate the internal atmosphere gas (e.g., $CO_2$). In an embodiment, the external atmosphere gas is air, which is mainly nitrogen that is less likely to dissolve in the immersion liquid before the bubble reaches a critical location such as the path of an exposure beam. Undesirably a bubble of such contaminated internal atmosphere gas will dissolve less easily, and more slowly, in the immersion liquid. The chances of a bubble reaching the immersion space 11 will increase, increasing the risk of defectivity. Note that there is also an advantage of using a plurality of gas supply openings 61 compared to a slit. This is provided that the dimensional tolerance of the plurality of gas supply openings 61 is less than the dimensional tolerance of the slit.

It is undesirable to have internal atmosphere gas, such as carbon dioxide, escape into the external atmosphere. It is desirable to reduce the interference of the carbon dioxide (or other gas) supplied by the gas supply openings 61 with components of the lithographic apparatus outside the fluid handling structure 12, such as an interferometer.

Either objective or both objectives of reducing or preventing the internal atmosphere gas from escaping into the external atmosphere and/or reducing or preventing the internal atmosphere gas from being contaminated with gas from the external atmosphere, may be done by providing a damper extending radially outward from the gas supply openings 61. The damper may comprise a damper surface 80 (also referred to as the outer damper surface 80), and an inner damper surface 90. The damper is a structure which can be considered to include the fluid recovery openings 210.

Damper surface 80 extends radially outwards from the fluid recovery openings 210. The damper surface 80 extends along the undersurface of the fluid handling structure 12. In an embodiment the damper surface 80 extends at least 0.5 mm radially outwards from the at least one fluid recovery opening 210 along the undersurface of the fluid handling structure 12 (i.e. the damper surface 80 has a radial width of at least 0.5 mm).

In an embodiment, the radial dimension of the damper surface 80 is at least as long as the radial dimension of the recirculation zone 96 below the damper surface 80, which is discussed further below. The lower limit of 0.5 mm for the radial dimension of the damper surface 80 represents the approximate lower limit of the radial dimension of the recirculation zone 96. The radial dimension of the recirculation zone 96 is approximately five times the working distance, which is the distance between the undersurface of the fluid handling structure 12 and the facing surface. In an embodiment the working distance is at least about 100 µm.

In an embodiment the separation between the fluid recovery openings 210 and the outer radial edge 98 of the undersurface of the fluid handling structure 12 is at most about 3.0 mm. However, this separation is dependent on the operating distance between the undersurface of the fluid handling structure 12 and the facing surface. If the operating distance (or "flight height") increases, the separation should be increased. If the operating distance decreases, for example to 150 micrometers, the damper surface 80 may be reduced, for example to 1 mm. Hence in an embodiment the radial dimension of the damper surface 80 is within the range of from about 0.5 mm to about 5.0 mm, desirably in the range of 0.5 mm to 3.0 mm. The radial dimension of the damper surface 80 may be substantially equal to the separation between the fluid recovery openings 210 and the outer radial edge 98 of the undersurface. In an embodiment, the radial dimension of the damper surface 80 is at least about 1.0 mm. In an embodiment, the radial dimension of the damper surface 80 is at most about 2.0 mm. In an embodiment, the radial dimension of the damper surface 80 is about 1.5 mm.

The damper surface 80 helps to reduce the flow of internal atmosphere gas, such as carbon dioxide, from the at least one gas supply opening 61 to the exterior of the fluid handling structure 12. For example, the refractive index of carbon dioxide is different from the refractive index of air. Carbon dioxide that reaches a region radially outwards of the outer radial edge 98 of the fluid handling structure (i.e. the external atmosphere) can affect the desired refractive index of the air that may be present in the environment surrounding the fluid handling structure 12. Variations to the refractive index can inhibit the desired performance of optical systems such as encoder and interferometer systems from being achieved. Similar problems can be caused by any gas that has a refractive index that is different to the refractive index of the external atmosphere. Hence, the presence of internal atmosphere gas in the environment radially outwards of the fluid handling structure 12 can reduce the performance of optical systems that are affected by the refractive index of the gas in their environment.

In an embodiment the damper surface 80 and the rest of the lithographic apparatus are configured such that the concentration of internal atmosphere gas outside of the fluid handling structure is at most about 0.225%. This may be considered as an acceptable level of, for example, carbon dioxide in the environment outside of the fluid handling structure 12. Depending on the particular components and their applications, the acceptable level may be greater than or less than 0.225% of the internal atmosphere gas. In an embodiment the lithographic apparatus is configured such that the concentration of internal atmosphere gas (e.g., carbon dioxide) in the environment immediately surrounding and coming into contact with the meniscus 320 is at least 95%, desirably at least 99% and more desirably at least 99.9%.

Figure 8:
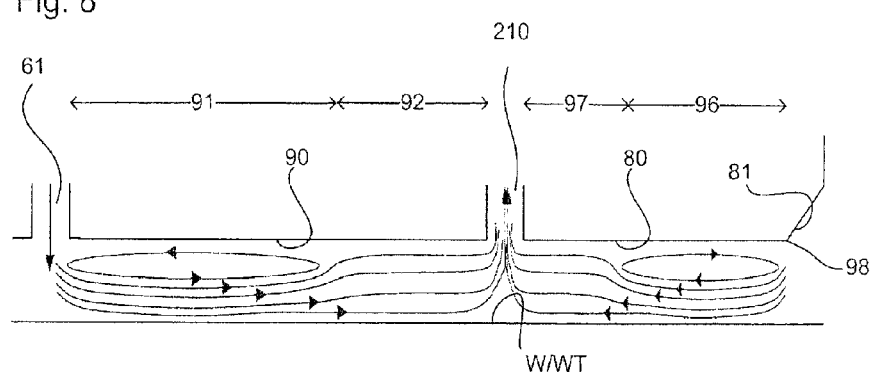
FIG. 8 depicts, in cross-section, a part of a fluid handling system for use in a lithographic projection apparatus.

The supply of, for example, carbon dioxide through the at least one gas supply opening 61 results in complex gas flows in the region above the facing surface and below the undersurface of the fluid handling structure 12. For example as depicted in FIG. 8 there may be a recirculation zone 96 below the damper surface 80 and/or a recirculation zone 91 in the region below the fluid handling structure 12 between the at least one gas supply opening 61 and the at least one fluid recovery opening 210. In FIG. 8 the arrows indicate the local direction of gas flow. The net direction of gas flow in FIG. 8 is from the at least one gas supply opening 61 to the at least one fluid recovery opening 210, and from radially outwards of the fluid handling structure 12 (the extreme right in FIG. 8) towards the at least one fluid recovery opening 210.

Although the net flow direction is from the at least one gas supply opening 61 to the at least one fluid recovery opening 210, the recirculation zone 91 results in local flows of gas towards the at least one gas supply opening 61. Recirculation zone 96 below the damper surface 80 is similar in that local gas flows oppose the net gas flow direction.

The local gas flows that are opposite to the net flow direction can result in undesirable mixing of gases. For example, the recirculation zone 96 below the damper surface 80 can in principle result in internal atmosphere gas (e.g., carbon dioxide) flowing from the at least one fluid recovery opening 210 to the region radially outwards of the fluid handling structure 12, although the damper surface 80 at least partly reduces or prevents this from happening. Similarly, the recirculation zone 91 can result in external atmosphere gas (e.g., air) flowing from radially outwards of the at least one fluid recovery opening 210 to the at least one gas supply opening 61. If the external atmosphere gas reaches the at least one gas supply opening 61, then the external atmosphere gas may flow along with the net flow of internal atmosphere gas from the at least one gas supply opening 61 to the meniscus 320. A radially inner damper surface 90 at least partly reduces or prevents this from happening.

In an embodiment the damper surface 80 has a radial dimension such that the external atmosphere gas radially outwards of the fluid handling structure 12 cannot reach the recirculation zone radially outwards of the at least one fluid recovery opening 210. In an embodiment, the radial dimension of the damper surface 80 is at least the radial dimension of the recirculation zone below the damper surface 80. In an embodiment the radial dimension of the damper surface 80 is greater than the radial dimension of the recirculation zone such that a barrier 97 is created. The barrier 97 corresponds to the region below the damper surface 80 that is not occupied by the recirculation zone.

The barrier 97 reduces or prevents internal atmosphere gas from reaching the region radially outward of the fluid handling structure 12. This is because the barrier 97 helps prevent the internal atmosphere gas from reaching the recirculation zone 96 under the damper surface 80. In the region of the barrier 97 substantially all of the gas flow is towards the at least one fluid recovery opening 210, i.e. in the net flow direction. The radial dimension of the barrier 92, 97 is the radial dimension of the damper surface 80, 90 that is in addition to the radial dimension of the associated recirculation zone 91, 96.

Figure 9:
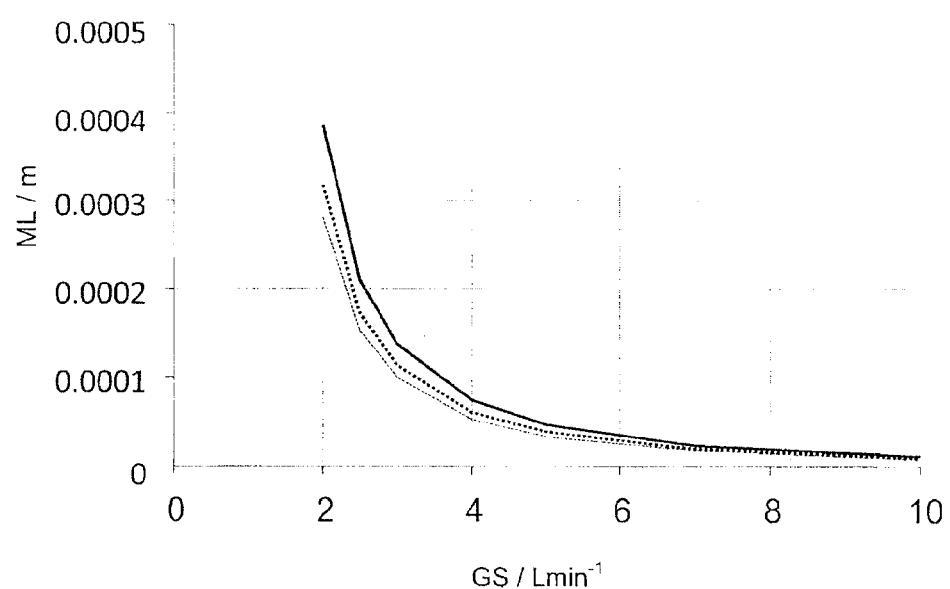
FIG. 9 depicts a graph showing the relationship between gas flow speed (between the fluid handling structure and the facing surface) and mixing length according to an embodiment of the invention.

FIG. 9 depicts a graph showing the relationship between gas flow speed GS (between the fluid handling structure 12 and the facing surface) and mixing length ML. The x-axis shows the gas flow speed GS between the fluid handling structure 12 and the facing surface. The gas flow speed GS is measured when the facing surface is stationary relative to the fluid handling structure 12. The gas flow speed GS is measured in the region of the barrier 92, 97. The y-axis shows the mixing length ML. The mixing length ML is the radial dimension of the barrier 92, 97 that results in a certain proportion of mixing between the two gases.

Each of the four lines corresponds to a different proportion of mixing. The solid line represents a mixing proportion of 225 ppm. This means that the proportion of gas that has reached from the recirculation zone 91, 96 to the other end of the barrier 92, 97 (i.e. against the flow of the barrier 92, 97) is 225 ppm. The dotted line represents a mixing proportion of 1000 ppm. The dashed line represents a mixing proportion of 2250 ppm.

The graph corresponds to a lithographic apparatus in which the working distance is 150 µm and the facing surface is moving at a speed of about 1 meter per second relative to the fluid handling structure 12.

The graph shows that the proportion of mixing decreases as the radial dimension of the barrier 92, 97 increases. The graph shows that the proportion of mixing decreases as the gas flow speed GS increases. The graph shows that (for a substrate velocity of 1 m/s and a working distance of 150 µm) a mean standstill gas flow speed GS under the damper of about 2.5 m/s and a barrier 92, 97 having a radial dimension of about 200 µm results in a mixing proportion of about 1000 ppm. The recirculation zone 91, 96 may have a radial dimension of about 750 µm (fives times the working distance). Hence the length of the damper surface 80, 90 may be about 950 µm (recirculation zone plus barrier).

The gas flow in the region under the damper surface 80 is similar to the gas flow in the region under the fluid handling structure 12 between the at least one gas supply opening 61 and the at least one fluid recovery opening 210. FIG. 8 depicts exemplary gas flows in both regions. The gas flows are, to an extent, mirror images of each other in form in that the net gas flow directions are opposite to each other in the two regions.

As depicted in FIG. 8 in an embodiment the separation between the at least one gas supply opening 61 and the at least one fluid recovery opening 210 is at least the radial dimension of the recirculation zone 91. In an embodiment the separation, which corresponds to the radial dimension of the radially inner damper surface 90, is greater than the radial dimension of the recirculation zone 91 such that a barrier 92 is present. The barrier 92 reduces or prevents external atmosphere gas from reaching the recirculation zone 91. The barrier 92 reduces or prevents external atmosphere gas from flowing to the at least one gas supply opening 61, and reduces or prevents the external atmosphere gas from reaching the meniscus 320.

The considerations of the radial dimension of the damper surface 80 are similar to the considerations for the length of the radially inner damper surface 90. In the description below, for brevity considerations mainly, the length of the damper surface 80 will be considered. The radial dimensional constraints of the damper surface 80 are equally applicable to the dimension of the separation between the at least one gas supply opening 61 and the at least one fluid recovery opening 210. For example, in an embodiment the separation between the at least one gas supply opening 61 and the at least one fluid recovery opening 210 is at least about 0.5 mm. In an embodiment the separation between the at least one gas supply opening 61 and the at least one fluid recovery opening 210 is at most about 3.0 mm.

In an embodiment the outer radial edge 98 of the undersurface of the fluid handling structure is connected to a chamfer 81. The chamfer 81 connects the undersurface to a side surface of the fluid handling structure 12. The chamfer reduces the size of the recirculation zone radially outwards of the at least one fluid recovery opening 210. This means that the radial dimension or width of the damper surface 80 can be reduced whilst retaining its function of reducing the flow of internal atmosphere gas radially outwards from the fluid handling structure 12. In an embodiment the chamfer 81 makes an angle with the undersurface in the range of from about 30° to about 60°, desirably about 45°.

The radial dimension of a recirculation zone (either the recirculation zone 91 or the recirculation zone 96) is approximately five times the working distance. The working distance is the distance between the undersurface of the fluid handling structure 12 and the facing surface (e.g. the surface of the substrate W or the surface of the substrate table WT).

In an embodiment the separation between the at least one fluid recovery opening 210 and the outer radial edge 98 of the undersurface is at least five times the distance between the fluid handling structure 12 and the facing surface. In an embodiment the separation between the at least one gas supply opening 61 and the at least one fluid recovery opening 210 is at least five times the distance between the fluid handling structure and the facing surface.

The working distance may be in the range of from about 100 µm to about 750 µm, desirably about 100 µm to about 200 µm. If the working distance is less than 100 µm, then safety of the lithographic apparatus can be jeopardized. This is because there may be stickers and/or sensors on the facing surface that have a non-zero height. Hence, the fluid handling structure 12 should be operated at a working distance so as to allow it move over the relief of the facing surface. If the working distance is less than 100 µm, then a vertical displacement of the facing surface is more likely to result in contact with the fluid handling structure 12. A working distance of more than 100 µm may be desirable because this allows more time for the fluid handling structure 12 and/or facing surface to be moved in response to a vertical displacement of the facing surface and/or fluid handling structure 12 so as to reduce the possibility of contact. In an embodiment to avoid mutual contact between the facing surface and the liquid handling structure 12, the controller 500 is configured to control the lithographic apparatus such that the fluid handling structure 12 moves in response to vertical displacement of the facing surface and/or the facing surface moves in response to vertical displacement of the facing surface.

A working distance of greater than 200 µm or even 750 µm is possible. However such an elevated working distance may be undesirable because more immersion liquid may be lost from the space 11. Larger bubbles may be consequentially created which can reduce the imaging quality. Typically the working distance may be about 150 µm. In an embodiment the damper surface 80 is at least 0.75 mm in length. In an embodiment the radially inner damper surface 90 is at least 0.75 mm in length. 0.75 mm is chosen because it is the approximate length of the recirculation zones 91, 96 when the working distance is 150 µm.

The relative speed between the fluid handling structure 12 and the facing surface affects the gas flow between the undersurface and the facing surface. Typically the speed of the substrate W or substrate table WT relative to the fluid handling structure 12 may be about 1 meter per second. If the relative speed is increased, then the radial dimension of the damper surface 80 should be increased.

The acceptable level of internal atmosphere gas (e.g., carbon dioxide) that escapes to the region radially outwards of the fluid handling structure 12 affects the length of the damper surface 80. Similarly the acceptable level of flow of external atmosphere gas towards the meniscus 320 affects the separation between the at least one gas supply opening 61 and the at least one fluid recovery opening 210. If the allowable in-leak of gas (e.g., carbon dioxide or air) increases, then the length of the damper surface 80 can be decreased.

The speed of the gas flow in the space between the undersurface and the facing surface while the substrate W or substrate table WT is stationary affects the length of the damper surface 80. A typical gas flow speed when the facing surface is stationary with respect to the fluid handling structure 12 may be in the range of from about 2 meters per second to about 5 meters per second. However higher gas flow speeds are possible, for example up to about 25 meters per second. As the gas flow speed increases, the length of the damper surface 80 decreases. This is because the increased gas flow speed makes it less likely for gas to flow in the opposite direction to the net flow direction.

The gas flow speeds in the space between the undersurface and the facing surface depend on the rates of supplying and recovering gas via the openings 61, 210. In an embodiment the immersion lithographic apparatus is configured such that the at least one gas supply opening 61 supplies gas at a rate of at least about 15 liters per minute. In an embodiment the immersion lithographic apparatus is configured such that the at least one gas supply opening 61 supplies gas at a rate of at most about 90 liters per minute. In an embodiment the immersion lithographic apparatus is configured such that the at least one gas supply opening 61 supplies gas at a rate of at most about 40 liters per minute.

In an embodiment the immersion lithographic apparatus is configured such that the at least one fluid recovery opening 210 recovers gas at a rate of at least about 10 liters per minute. In an embodiment the immersion lithographic apparatus is configured such that the at least one fluid recovery opening 210 recovers gas at a rate of at most about 60 liters per minute. In an embodiment the immersion lithographic apparatus is configured such that the at least one fluid recovery opening 210 recovers gas at a rate of at most about 25 liters per minute.

In an embodiment the immersion lithographic apparatus is configured such that the meniscus pinning feature recovers gas at a rate of at least about 10 liters per minute. In an embodiment the immersion lithographic apparatus is configured such that the meniscus pinning feature recovers gas at a rate of at most about 60 liters per minute. In an embodiment the immersion lithographic apparatus is configured such that the meniscus pinning feature recovers gas at a rate of at most about 25 liters per minute.

With these flow rates and gas speeds, the barrier may have a length of from about 100 μm to about 300 μm, desirably about 200 μm. The length of the damper surface 80 comprises the barrier length in addition to the length of the recirculation zone.

In an embodiment the separation between the at least one fluid recovery opening 210 and the outer radial edge 98 of the undersurface is at least the sum of 0.2 mm and five times the distance between the fluid handling structure 12 and the facing surface. In an embodiment the separation between the at least one gas supply opening 61 and the at least one fluid recovery opening 210 is at least the sum of 0.2 mm and five times the distance between the fluid handling structure 12 and the facing surface.

In an embodiment the length of the damper surface 80 is substantially equal to the separation between the at least one gas supply opening 61 and the at least one fluid recovery opening 210. In an embodiment the length of the damper surface 80 is less than the separation between the at least one fluid recovery opening 210 and the at least one gas supply opening 61.

The portion of the undersurface that separates the at least one fluid recovery opening 210 and the at least one gas supply opening 61 may form the inner damper surface 90. The inner damper surface 90 is radially inwards of the outer damper surface 80. In an embodiment, the length of the inner damper surface 90 is substantially equal to the length of the outer damper surface 80. The inner damper surface 90 is configured to restrict gas flow from the at least one fluid recovery opening 210 to the at least one gas supply opening 61. The outer damper surface is configured to restrict gas flow from the at least one fluid recovery opening 210 to radially outwards of the fluid handling structure 12. In an embodiment the inner damper surface 90 and the outer damper surface 80 restrict the gas flows approximately equally.

In such an arrangement gas supplied from the gas supply openings 61 is substantially blocked from reaching the external atmosphere by the damper. The damper substantially blocks gas flow from the external atmosphere from reaching the atmosphere around the meniscus. Such a damper may be referred to as a blocking damper. The blocking damper serves as a barrier to radial gas flow between the atmosphere around the meniscus and the external atmosphere. Radial gas flow between the gas supply opening 61 and the atmosphere external the fluid handling structure is substantially prevented. Mixing of a gas flow from the gas supply openings 61 and a gas flow from the external atmosphere is thereby substantially prevented from occurring under the fluid handling structure 12.

In an embodiment the separation between the at least one fluid recovery opening 210 and the at least one gas supply opening 61 is about 1.5 mm and the length of the damper surface 80 is at least 1.5 mm.

The above embodiments have been described with reference to the presence of only one linear array of gas supply openings 61 surrounding the meniscus pinning features. However, an embodiment of the present invention is equally applicable to the case where a second (or more) plurality of gas supply openings 61 in a linear array is positioned at least partly to surround the first plurality of gas supply openings 61. The arrangement may be similar to that described in U.S. patent application publication no. US 2011-0090472 except that one or both of the two slit gas knives are replaced with a plurality of discrete gas supply openings as described hereinabove. This may be advantageous where particularly fast relative movement between the fluid handling system 12 and the facing surface occurs. Such a larger relative velocity may be used in a lithographic apparatus for exposing substrates having a larger diameter than the current industry standard of 300 mm, for example substrates of 450 mm in diameter.

In an embodiment, there is provided a fluid handling structure for a lithographic apparatus comprising a projection system and a substrate table configured to support a substrate, the fluid handling structure configured to confine immersion liquid to a space between the projection system and a facing surface, the fluid handling structure having an undersurface region external and surrounding the space, wherein the fluid handling structure has: a gas supply opening outward of the space, the gas supply opening configured to supply a gas flow between the undersurface and the facing surface; and a blocking damper between the gas supply opening and an outer edge of the undersurface of the fluid handling structure, the blocking damper configured to substantially block a radial gas flow from the gas supply opening to an atmosphere external the fluid handling structure, or to substantially block a radial gas flow from the external atmosphere to the gas supply opening, or both, so as to substantially prevent mixing between the gas from the gas supply opening and the external atmosphere.

In an embodiment, the blocking damper comprises a fluid recovery opening located in the undersurface radially outward of the gas supply opening. In an embodiment, an underpressure is applied to the fluid recovery opening to remove gas flowing from radially inward and radially outward of the fluid recovery opening. In an embodiment, the blocking damper includes an outer damper configured to block radial inward gas flow from the external atmosphere. In an embodiment, the gas removal opening is radially outward of the blocking damper. In an embodiment, the blocking damper includes a damper configured to substantially prevent radial outward gas flow from between the fluid handling structure and the facing surface. In an embodiment, the gas removal opening is radially inward of the damper. In an embodiment, the gas supplied through the gas supply opening is a gas which readily dissolves in water, such as carbon dioxide, and the immersion liquid is an aqueous liquid.

In an embodiment, there is provided a fluid handling structure for a lithographic apparatus, the fluid handling structure having, at a boundary of a space configured to contain immersion fluid to a region external to the fluid handling structure: a gas supply opening radially outward of the space; and a fluid recovery opening radially outward of the gas supply opening, wherein the separation between the fluid recovery opening and an outer radial edge of an undersurface of the fluid handling structure is less than or equal to the separation between the gas supply opening and the fluid recovery opening.

In an embodiment, there is provided a fluid handling structure that has, at a boundary of a space configured to contain immersion fluid to a region external to the fluid handling structure: a gas supply opening radially outward of the space; a fluid recovery opening radially outward of the gas supply opening; an outer damper surface extending radially outwards from the fluid recovery opening along an undersurface of the fluid handling structure so as to restrict a gas flow from the gas recovery opening to an outer radial edge of the undersurface of the fluid handling structure; and an inner damper surface extending radially between the gas supply opening and the fluid recovery opening along the undersurface of the fluid handling structure so as to restrict a gas flow from the fluid recovery opening to the gas supply opening, wherein the inner damper surface and the outer damper surface restrict the gas flows approximately equally.

In an embodiment, there is provided a fluid handling structure for a lithographic apparatus, the fluid handling structure having, at a boundary of a space configured to contain immersion fluid to a region external to the fluid handling structure: a gas supply opening radially outward of the space; a fluid recovery opening radially outward of the gas supply opening; and a damper surface extending at least 0.5 mm radially outwards from the fluid recovery opening along an undersurface of the fluid handling structure.

In an embodiment, the separation between the fluid recovery opening and an outer radial edge of the undersurface of the fluid handling structure is at most about 3.0 mm. In an embodiment, the separation between the gas supply opening and the fluid recovery opening is in the range of from about 0.5 mm to about 3.0 mm. In an embodiment, an outer radial edge of the undersurface is connected to a chamfer connecting the undersurface to a side surface of the fluid handling structure. In an embodiment, the fluid handling structure is configured such that the gas supply opening supplies a gas containing carbon dioxide. In an embodiment, the gas supply opening comprises an opening of a gas knife. In an embodiment, the gas supply opening comprises a continuous opening that surrounds the space. In an embodiment, the fluid recovery opening comprises a continuous opening that surrounds the gas supply opening. In an embodiment, the gas supply opening has, in plan, a cornered shape. In an embodiment, the fluid recovery opening has, in plan, a cornered shape. In an embodiment, the fluid handling structure comprises, at the boundary of the space, a meniscus pinning feature to resist passage of immersion fluid in a radially outward direction from the space, wherein the gas supply opening is radially outward of the meniscus pinning feature. In an embodiment, the separation between the meniscus pinning feature and the gas supply opening is in the range of from about 0.5 mm to about 2.5 mm. In an embodiment, the meniscus pinning feature comprises a plurality of openings in a linear array.

In an embodiment, there is provided a fluid handling structure that has, at a boundary of a space configured to contain immersion fluid to a region external to the fluid handling structure: a gas supply opening radially outward of the space; a fluid recovery opening radially outward of the gas supply opening; and a damper surface extending radially outwards from the fluid recovery opening along an undersurface of the fluid handling structure, wherein the separation between the fluid recovery opening and an outer radial edge of the undersurface is at least five times the distance between the fluid handling structure and a facing surface facing a projection system of the immersion lithographic apparatus.

In an embodiment, the separation between the fluid recovery opening and the outer radial edge of the undersurface is at least five times the distance between the fluid handling structure and the facing surface. In an embodiment, the separation between the fluid recovery opening and the outer radial edge of the undersurface is at least the sum of 0.2 mm and five times the distance between the fluid handling structure and the facing surface. In an embodiment, the separation between the gas supply opening and the fluid recovery opening is at least five times the distance between the fluid handling structure and the facing surface. In an embodiment, the separation between the gas supply opening and the fluid recovery opening is at least the sum of 0.2 mm and five times the distance between the fluid handling structure and the facing surface. In an embodiment, the fluid handling structure is configured such that the gas supply opening supplies gas at a rate in the range of from about 15 liters per minute to about 90 liters per minute. In an embodiment, the fluid handling structure is configured such that the fluid recovery opening recovers gas at a rate in the range of from about 10 liters per minute to about 60 liters per minute. In an embodiment, the fluid handling structure comprises, at the boundary of the space, a meniscus pinning feature to resist passage of immersion fluid in a radially outward direction from the space, wherein the meniscus pinning feature recovers gas at a rate in the range of from about 10 liters per minute to about 60 liters per minute. In an embodiment, the fluid handling structure is configured such that a gas velocity from the gas supply opening to the meniscus pinning feature is in the range of from about 2 meters per second to about 5 meters per second. In an embodiment, the fluid handling structure is configured such that a gas velocity from the gas supply opening to the fluid recovery opening is in the range of from about 2 meters per second to about 5 meters per second. In an embodiment, the gas supply opening comprises a plurality of gas supply openings in a linear array. In an embodiment, the fluid recovery opening comprises a plurality of fluid recovery openings in a linear array.

In an embodiment, there is provided an immersion lithographic apparatus, comprising: a projection system; a substrate table configured to support a substrate; and the fluid handling structure as described herein, wherein the fluid handling structure is configured to confine immersion liquid to a space between the projection system and a facing surface facing the projection system.

In an embodiment, there is provided a device manufacturing method, comprising: projecting a patterned beam of radiation through an immersion liquid confined to a space between a projection system and a substrate by a fluid handling structure; providing gas through a gas supply opening to a position adjacent a meniscus of the immersion liquid; recovering gas through a fluid recovery opening radially outward of the gas supply opening; and damping the movement of gas from the fluid recovery opening to radially outward of the fluid handling structure by a damper surface extending at least 0.5 mm radially outwards from the fluid recovery opening along the undersurface of the fluid handling structure.

In an embodiment, there is provided a device manufacturing method, comprising: projecting a patterned beam of radiation through an immersion liquid confined to a space between a projection system and a substrate by a fluid handling structure; providing gas through a gas supply opening to a position adjacent a meniscus of the immersion liquid; recovering gas through a fluid recovery opening radially outward of the gas supply opening; and damping the movement of gas from the fluid recovery opening to radially outward of the fluid handling structure by a damper surface extending radially outwards from the fluid recovery opening along the undersurface of the fluid handling structure, wherein the separation between the fluid recovery opening and an outer radial edge of the undersurface is at least five times the distance between the fluid handling structure and a facing surface facing the projection system.

As will be appreciated, any of the above described features can be used with any other feature and it is not only those combinations explicitly described which are covered in this application. For example, an embodiment of the invention could be applied to the embodiments of FIGS. 2 to 4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or read-head associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or read-heads. The one or more of sensors, transducers or read-heads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or read-heads that cooperate with the scale(s) or grid(s) to determine the position, velocity, etc. of the component.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus comprising a projection system and a substrate table configured to support a substrate, the fluid handling structure configured to confine immersion liquid to a space between the projection system and a facing surface, the fluid handling structure having an undersurface region external and surrounding the space, wherein the fluid handling structure has:
    a gas supply opening outward of the space, the gas supply opening configured to supply a gas flow between the undersurface and the facing surface;
    a fluid recovery opening outward, relative to the space, of the gas supply opening; and
    (i) a first continuous blocking damper surface connecting the gas supply opening to the fluid recovery opening, the first continuous blocking damper surface configured to substantially block, at a location between the gas supply opening and the fluid recovery opening, a gas flow in a direction from the fluid recovery opening toward the gas supply opening, or (ii) a second continuous blocking damper surface connecting the fluid recovery opening to an outer edge of the undersurface of the fluid handling structure, the second continuous blocking damper surface configured to substantially block, at a location between the fluid recovery opening and the outer edge, a gas flow in a direction from the fluid recovery opening toward an atmosphere external the fluid handling structure, or both (i) and (ii), so as to substantially prevent mixing between the gas from the gas supply opening and the external atmosphere.

2. The fluid handling structure of claim 1, wherein an underpressure is applied to the fluid recovery opening to remove gas flowing from radially inward and radially outward of the fluid recovery opening.

3. The fluid handling structure of claim 1, wherein the gas supplied through the gas supply opening is a gas which readily dissolves in water and the immersion liquid is an aqueous liquid.

4. The fluid handling structure of claim 1, wherein the separation between the fluid recovery opening and the outer edge of the undersurface of the fluid handling structure is at most about 3.0 mm.

5. The fluid handling structure of claim 1, wherein the gas supply opening comprises an opening of a gas knife.

6. The fluid handling structure of claim 1, wherein (i) the gas supply opening comprises a continuous opening that surrounds the space, or (ii) the fluid recovery opening comprises a continuous opening that surrounds the gas supply opening, or (iii) both (i) and (ii).

7. The fluid handling structure of claim 1, wherein (i) the gas supply opening has, in plan, a cornered shape, or (ii) the fluid recovery opening has, in plan, a cornered shape, or (iii) both (i) and (ii).

8. The fluid handling structure of claim 1, comprising, at the boundary of the space, a meniscus pinning feature to resist passage of immersion fluid in a radially outward direction from the space, wherein the gas supply opening is outward, relative to the space, of the meniscus pinning feature.

9. The fluid handling structure of claim 8, wherein the meniscus pinning feature comprises a plurality of openings in a linear array.

10. The fluid handling structure of claim 1, wherein (i) the gas supply opening comprises a plurality of gas supply openings in a linear array, or (ii) the fluid recovery opening comprises a plurality of fluid recovery openings in a linear array, or (iii) both (i) and (ii).

11. The fluid handling structure of claim 1, comprising the first continuous blocking damper surface connecting the gas supply opening to the fluid recovery opening.

12. The fluid handling structure of claim 1, comprising the second continuous blocking damper surface connecting the fluid recovery opening to an outer edge of the undersurface of the fluid handling structure.

13. The fluid handling structure of claim 1, comprising the first continuous blocking damper surface connecting the gas supply opening to the fluid recovery opening and the second continuous blocking damper surface connecting the fluid recovery opening to an outer edge of the undersurface of the fluid handling structure.

14. A fluid handling structure that has, between a boundary of a space configured to contain immersion fluid and a region external to the fluid handling structure:
a gas supply opening outward of the space;
a fluid recovery opening outward, relative to the space, of the gas supply opening; and
a continuous damper surface extending outwards, relative to the space, from the gas supply opening along an undersurface of the fluid handling structure to the fluid recovery opening, wherein the length of the damper surface between the gas supply opening and the fluid recovery opening in a direction from the gas supply opening toward an outer edge of the undersurface is at least five times the distance between the fluid handling structure and a facing surface facing a projection system of the immersion lithographic apparatus.

15. A fluid handling structure for a lithographic apparatus, the fluid handling structure having, between a boundary of a space configured to contain immersion fluid and a region external to the fluid handling structure:
a gas supply opening outward of the space; and
a fluid recovery opening outward, relative to the space, of the gas supply opening,
wherein (i) the separation between the fluid recovery opening and the outer edge of the undersurface of the fluid handling structure is greater than a cross-wise dimension of a recirculation zone of fluid in a gap between the fluid recovery opening and the outer edge, or (ii) the separation between the gas supply opening and the fluid recovery opening is greater than a cross-wise dimension of a recirculation zone of fluid in a gap between the gas supply opening and the fluid recovery opening, or (iii) both (i) and (ii).

16. A fluid handling structure that has, between a boundary of a space configured to contain immersion fluid and a region external to the fluid handling structure:
a gas supply opening outward of the space and being the nearest gas supply opening to an outer edge of an undersurface of the fluid handling structure in a radial direction from the space to the outer edge;
a fluid recovery opening outward, relative to the space, of the gas supply opening;
an outer damper surface extending outwards, relative to the space, from the fluid recovery opening along the undersurface of the fluid handling structure so as to restrict a gas flow from the gas recovery opening to the outer edge of the undersurface of the fluid handling structure; and
an inner damper surface extending outwards, relative to the space, between the gas supply opening and the fluid recovery opening along the undersurface of the fluid handling structure so as to restrict a gas flow from the fluid recovery opening to the gas supply opening,
wherein the inner damper surface and the outer damper surface restrict the gas flows approximately equally.

17. A fluid handling structure for a lithographic apparatus, the fluid handling structure having, between a boundary of a space configured to contain immersion fluid and a region external to the fluid handling structure:
a gas supply opening outward of the space;
a fluid recovery opening outward, relative to the space, of the gas supply opening; and
a continuous damper surface connecting the fluid recovery opening to an outer edge of the undersurface of the fluid handling structure, the damping surface extending at least 0.5 mm and at most 5 mm outwards, relative to the space, from the fluid recovery opening along the undersurface of the fluid handling structure, and the continuous damper surface configured to substantially block, at a location between the fluid recovery opening and the outer edge, a gas flow in a direction from the fluid recovery opening toward an atmosphere external the fluid handling structure so as to substantially prevent mixing between the gas from the gas supply opening and the external atmosphere.

18. The fluid handling structure of claim 17, wherein the outer edge of the undersurface is connected by a chamfer to a side surface of the fluid handling structure.

19. An immersion lithographic apparatus, comprising:
a projection system;
a substrate table configured to support a substrate; and
a fluid handling structure configured to confine immersion liquid to a space between the projection system and a facing surface facing the projection system, the fluid handling structure having an undersurface region external and surrounding the space, wherein the fluid handling structure has:
a gas supply opening outward of the space, the gas supply opening configured to supply a gas flow between the undersurface and the facing surface;
a fluid recovery opening outward, relative to the space, of the gas supply opening; and
(i) a first continuous blocking damper surface connecting the gas supply opening to the fluid recovery opening, the first continuous blocking damper surface configured to substantially block, at a location between the gas supply opening and the fluid recovery opening, a gas flow in a direction from the fluid recovery opening toward the gas supply opening, or (ii) a second continuous blocking damper surface connecting the fluid recovery opening to an outer edge of the undersurface of the fluid handling structure, the second continuous blocking damper surface configured to substantially block, at a location between the fluid recovery opening and the outer edge, a gas flow in a direction from the fluid recovery opening toward an atmosphere external the fluid handling structure, or both (i) and (ii), so as to substantially prevent mixing between the gas from the gas supply opening and the external atmosphere.

* * * * *